US006775801B2

(12) United States Patent
Wolf et al.

(10) Patent No.: US 6,775,801 B2
(45) Date of Patent: Aug. 10, 2004

(54) TURBO DECODER EXTRINSIC NORMALIZATION

(75) Inventors: Tod D. Wolf, Richardson, TX (US); Antonio F. Mondragon-Torres, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 104 days.

(21) Appl. No.: 10/202,509

(22) Filed: Jul. 24, 2002

(65) Prior Publication Data

US 2003/0093742 A1 May 15, 2003

Related U.S. Application Data

(60) Provisional application No. 60/325,404, filed on Sep. 26, 2001.

(51) Int. Cl.[7] ............................................. H03M 13/00
(52) U.S. Cl. ...................... 714/755; 708/700; 375/262; 375/341; 714/794; 714/795; 714/796
(58) Field of Search ................................. 714/755, 792, 714/794–796, 780, 786; 370/268, 342–343; 708/700; 375/262, 265, 341

(56) References Cited

U.S. PATENT DOCUMENTS 6,484,285 B1 * 11/2002 Dent ........................... 714/791
6,526,538 B1 * 2/2003 Hewitt ......................... 714/780

* cited by examiner

Primary Examiner—Guy J. Lamarre
(74) Attorney, Agent, or Firm—Robert D. Marshall, Jr.; W. James Brady, III; Frederick J. Telecky, Jr.

(57) ABSTRACT

This invention presents a unique implementation of the extrinsic block the turbo decoder that solves the problem of generation and use of precision extension and normalization in the alpha and beta metrics blocks. Both alpha metric inputs and beta metric inputs are processed via a circle boundary detector indicating the quadrant of the two's complement input and a precision extend block receiving an input and a corresponding circle boundary input. An extrinsics block includes a two's complement adder of the precision extended alpha and beta metrics inputs. The proposed solution obviates the need for normalization in the alpha and beta metric blocks.

6 Claims, 7 Drawing Sheets

$P(7)=[P(6) \times \gamma(001)]+[P(7) \times \gamma(110)]$    $P(7)=[P(3) \times \gamma(001)]+[P(7) \times \gamma(110)]$

801

802

803

804

805

TURBO DECODER EXTRINSIC NORMALIZATION

This application claims priority under 35 USC §119(e)(1) of Provisional Application No. 60/325,404, filed Sep. 26, 2001.

TECHNICAL FIELD OF THE INVENTION

The technical field of this invention is forward error correction using turbo decoders.

BACKGROUND OF THE INVENTION

Turbo codes are a type of forward error correction code with powerful capabilities. These codes are becoming widely used in many applications such as wireless handsets, wireless base stations, hard disk drives, wireless local area networks (LANs), satellites and digital television.

Turbo encoding is accomplished by means of concatenation of convolutional codes. FIG. 1A illustrates an example of a prior art rate ⅓ parallel-concatenated turbo encoder. The notation rate ⅓ refers to the configuration of FIG. 1A in which a single input bit stream $x_k$ is converted by the encoder into a 3-component bit stream. Input data stream 100 passes unmodified to multiplexer input 106. Two recursive systematic convolutional (RSC) encoders 102 and 103 function in parallel to transform their input bit streams. The resulting bit streams after transformation by RSC encoder 102 forms multiplexer input 107 and after transformation by RSC encoder 103 forms multiplexer input 108. Block 101 is an interleaver (I) which randomly re-arranges the information bits to decorrelate the noise for the decoder. RSC encoder 102 generates a $p1_k$ bit stream and RSC encoder 103 generates a $p2_k$ bit stream. Under control of a turbo controller function multiplexer 104 reassembles the separate bit streams $x_k$ 106, $p1_k$ 107 and $p2_k$ 108 into the resulting output bit stream $x_k/p1_k/p2_k$ 111.

FIG. 1B illustrates an example of the RSC encoder function which is a part of the blocks 102 or 103. Input data stream 120 passes unmodified to become output $x_0$ 131. After transformation by the RSC encoder the resulting bit streams 131, 132 and 133 in prescribed combinations form multiplexer inputs 107 and 108 of FIG. 1A. The precise combinations are determined by the class of turbo encoder being implemented, ½, ⅓, or ¼ for example. The action of the circuit of FIG. 1B is depicted by a corresponding trellis diagram which is illustrated in FIG. 4 and will be described in the text below.

This transmitted output bit stream 111 of FIG. 1A can be corrupted by transmission through a noisy environment. The function of the decoder at the receiving end is to reconstruct the original bit stream by tracing through multiple passes or iterations through the turbo trellis function.

FIG. 2 illustrates the functional block diagram of a prior art turbo decoder. A single pass through the loop of FIG. 2 is one iteration through the turbo decoder. This iterative decoder generates soft decisions from two maximum-a-posteriori (MAP) blocks 202 and 203. In each iteration MAP block 202 generates extrinsic information $W_{0,k}$ 206 and MAP block 203 generates extrinsic information $W_{1,k}$ 207. First MAP block 202 receives the non-interleaved data $x_k$ 200 and data $p1_k$ 201 as inputs. Second MAP decoder 203 receives data $p2_k$ 211 and interleaved $x_k$ data 210 from the interleaver block 208.

FIG. 3 illustrates the functional block diagram of a prior art MAP block. The MAP block of FIG. 3 includes circuit functions similar to those illustrated in FIG. 2. The MAP block calculates three vectors: beta state metrics, alpha state metrics and extrinsics. Both alpha block 302 and beta block 303 calculate state metrics. It is useful to define the function gamma as:

$$\Gamma_k = f(X_k, P_k, W_k) \quad [1]$$

where: $X_k$ is the systematic data; $P_k$ is the parity data; and $W_k$ is the extrinsics data.

Input 300 to the alpha state metrics block 302 and input 301 to beta state metrics block 302 are referred to as a-priori inputs. The beta state metrics are generated by beta state metrics block 303. These beta metrics are generated in reverse order and stored in the beta state random access memory (RAM) 304. Next, alpha state metrics are generated by alpha state metrics block 302. The alpha state metrics are not stored because the extrinsic block 305 uses this data as soon as it is generated. The beta state metrics are read from beta RAM 304 in a forward order at the same time as the alpha state metrics are generated. Extrinsic block 305 uses both the alpha and beta state metrics in a forward order to generate the extrinsics $W_{n,j}$ 306.

The variables for the MAP algorithm are usually represented by the natural logarithm of probabilities. This allows for simplification of very large scale integration (VLSI) implementation. The recursive equations for the alpha and beta state metrics are as follows:

$$A_{k,s} = \ln\left[\sum_s \exp\{A_{k-1} + \Gamma_k\}\right] \quad [2]$$

$$B_{k,s} = \ln\left[\sum_s \exp\{B_{k-1} + \Gamma_k\}\right] \quad [3]$$

where: s is the set of states in the trellis; and $\Gamma_k$ is as stated in equation [1] above.

FIG. 4 shows the trellis diagram for an 8-state state encoder. For a given state on the trellis, for example state 7 indicated by reference numbers 401 and 402, it is possible to write the probability equation for a given state in the form:

$$P(7) = [P(3) \times \gamma(001)] + [P(7) \times \gamma(110)] \quad [4]$$

for Alpha and $$P(7) = [P(6) \times \gamma(001)] + [P(7) \times \gamma(110)] \quad [5]$$

for Beta.

These equations are said to be of the form:

$$P = \text{MAX}^*(A, B) \quad [6]$$

where: A and B are the alpha and beta state metrics given by equations [2] and [3]. Equation 6 is referred to as the 'max star' equation, a simplification of the probability equations. The function P can be further expressed as:

$$P = \text{MAX}^*(A, B) = \text{MAX}(A, B) + f(-|A-B|) \quad [7]$$

and $f(-|A-B|)$ ranges from 0 to ln(2).

Turbo decoder processing is an iterative process requiring multiple cycles until a low bit-error ratio (BER) solution is obtained. Because the state of the trellis at the start of processing is unknown the probability of the occurrence of all the states in the trellis is initialized to a uniform constant. For each pass through the trellis, the probability of occurrence of a given state will increase or decrease as convergence to the original transmitted data proceeds. After processing through the trellis a number of times a set of states corresponding to the original transmitted data becomes dominant and the state metrics become reliable.

FIG. 4 illustrate a trellis diagram for an 8-state state encoder depicting the possible state transitions from each possible state $S_{k,x}$=ABC. For example, for state $S_{k,4}$, ABC= 001. These states are represented in FIG. 1B by the state of the three registers A 121, B 122 and C 123, respectively. In the decoder, the generation of the alpha state metrics requires processing the data in a forward direction through this trellis and the generation of the beta state metrics requires processing the data in a reverse direction through this trellis. Initial states in the trellis for forward traversal are labeled $S_{k,x}$ and next states are labeled $S_{k+1,x}$. Conversely, initial states in the trellis for reverse direction traversal are labeled $S_{k+1,x}$ and next states are labeled $S_{k,x}$. The nomenclature X/DEF of 403 and 404 of FIG. 4 refers to the next bit 'Y' inserted at the input $X_k$, 120 of FIG. 1B, followed by the forward slash, followed by the next three bits D, E and F generated respectively at the nodes 131, 132, 133 of FIG. 1B.

FIG. 5 illustrates an example of a prior art VLSI implementation of a four-stage beta state metric architecture. The first stage is an adder tree 501 which sums X, P, W and the beta state metrics depending on the trellis of the encoder. The implementation of the alpha block is the same as the beta block of FIG. 5, except the combinations of the operands in the adder tree. The second stage 502 to 509 is made up of a total of S blocks known as 'max star blocks'.

For a given state on the trellis, for example state 7 as already noted in FIG. 4, it is possible to write the probability equation in the form:

$$P(7)=[P(3)\times\gamma(001)]+[P(7)\times\gamma(110)] \qquad [8]$$

for Alpha and $$P(7)=[P(6)\times\gamma(001)]+[P(7)\times\gamma(110)] \qquad [9]$$

for Beta.
These equations are said to be of the form:

$$P=MAX^*(A, B) \qquad [10]$$

The max star equation is a simplification of the probability equations.

The third stage 511 of both the alpha and the beta metrics blocks determines which S-state metrics is the largest or equivalently, which S-state has the highest probability of occurring. The fourth stage 512 subtracts the largest metric from each of the S-state calculated values. The third and fourth stages are normalization stages.

There are corresponding set S-state metrics for each given time k. The state metric with the highest value is the most probable state in the trellis at time k. The effect of normalization is to bound the fixed-point precision and prevent fixed-point overflow. The normalization described here assigns this most probable state with the state value 0 and the state values of other states a negative value.

FIG. 6 illustrates a block diagram of the prior art extrinsic architecture. The first stage 601 is another adder tree which sums the beta state metrics, alpha state metrics and the parity. The other extrinsic stages include two-part max star tree. The first part, max star blocks 602 to 605, calculates the log probability of a '1' in the top half of the tree represented by blocks 602 and 603 and calculates the log probability of a '0' in the bottom half of the tree represented by blocks 604 and 605. The second part of the max star blocks includes blocks 606 and 607. The last stage including max star blocks 608 and 609, and summer 610 subtracts the two log probabilities to generate the extrinsic $W_k$.

The adder tree 601 generates 2S number of operands for the max star tree. If the bit precision of the state metrics and parity have the same number of bits such as x, then the sum of the three will require x+2 bits for each operand. Note that the result of each addition operation requires one extra bit of precision.

SUMMARY OF THE INVENTION

Conventional turbo decoders have implementations that require two's complement representation and normalization for quantities used in the computation of extrinsic values. This leads to performance loss, specifically added latency, in functional blocks carrying out the required normalization and calculation of these extrinsic values. This invention presents a unique implementation of normalization in the extrinsic block of the turbo decoder that solves the difficulties that accompany normalization, and the generation and use of precision extension in the alpha and beta metric blocks. The implementation achieves improved performance as compared to earlier approaches and does so without the added gate usage and latency resulting from normalization in the alpha metrics and beta metrics blocks. The normalization used obviates the need for normalization in the alpha metrics and beta metrics blocks.

BRIEF DESCRIPTION OF THE DRAWINGS

These and other aspects of this invention are illustrated in the drawings, in which.

DETAILED DESCRIPTION OF PREFERRED EMBODIMENTS

Figure 1A:
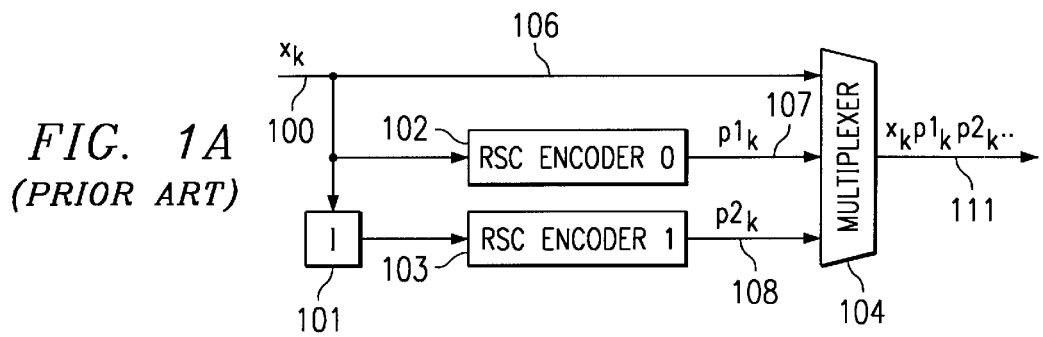
FIG. 1A illustrates the block diagram of a turbo encoder function of the prior art.
Figure 1B:
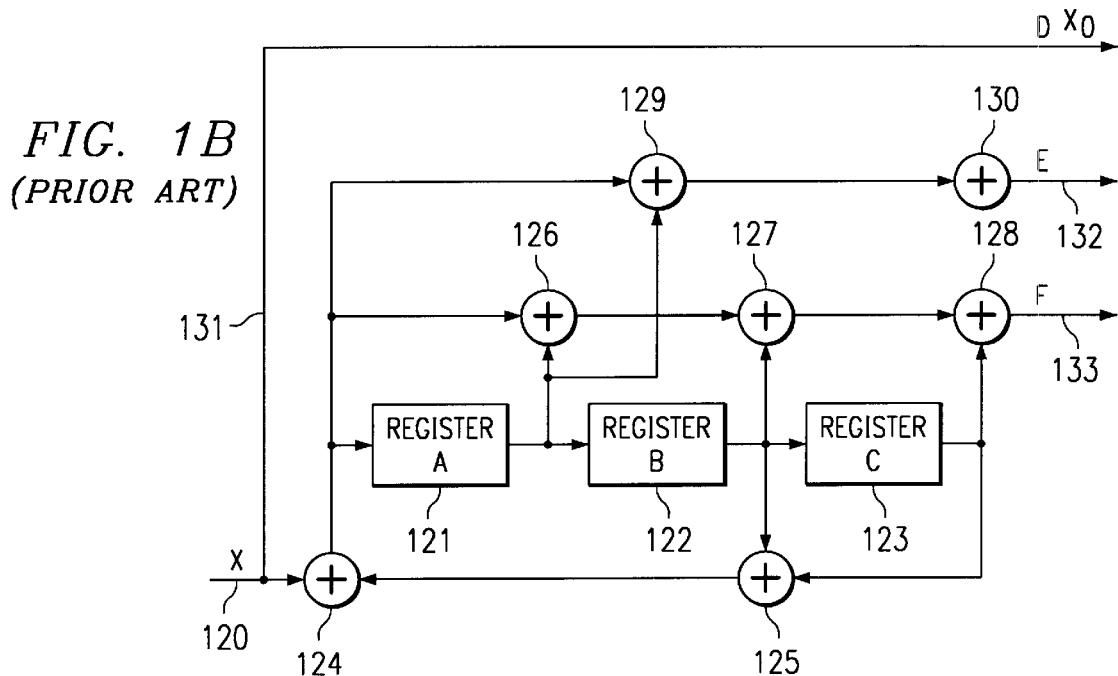
FIG. 1B illustrates the circuit diagram of a prior art RSC encoder function used in the implementation of a turbo encoder.
Figure 2:
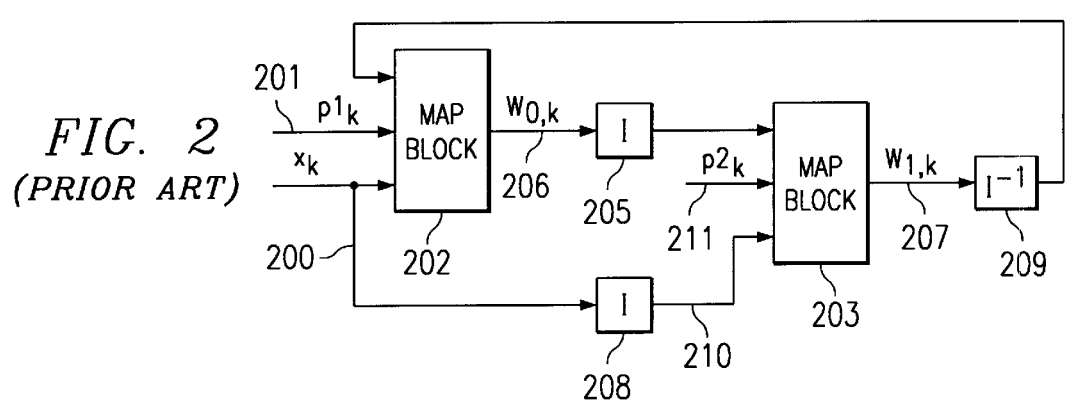
FIG. 2 illustrates a functional block diagram of a MAP decoder of the prior art.
Figure 3:
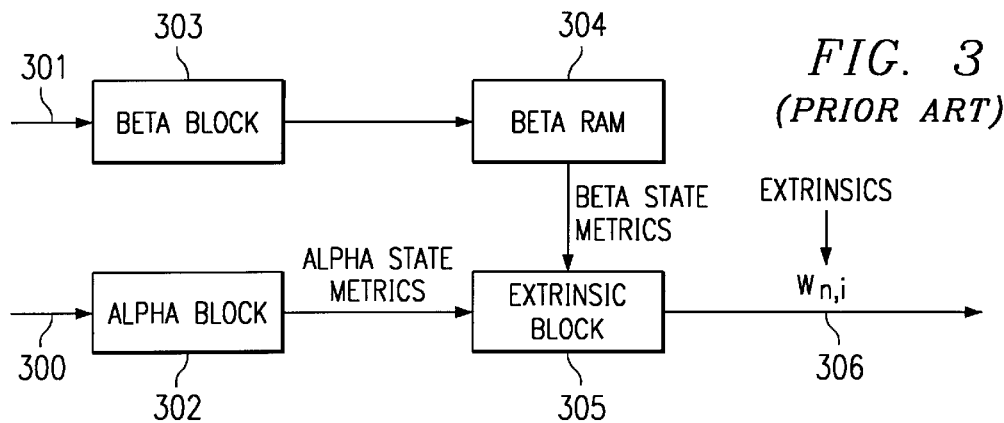
FIG. 3 illustrates a functional block diagram of a turbo decoder of the prior art.
Figure 4:
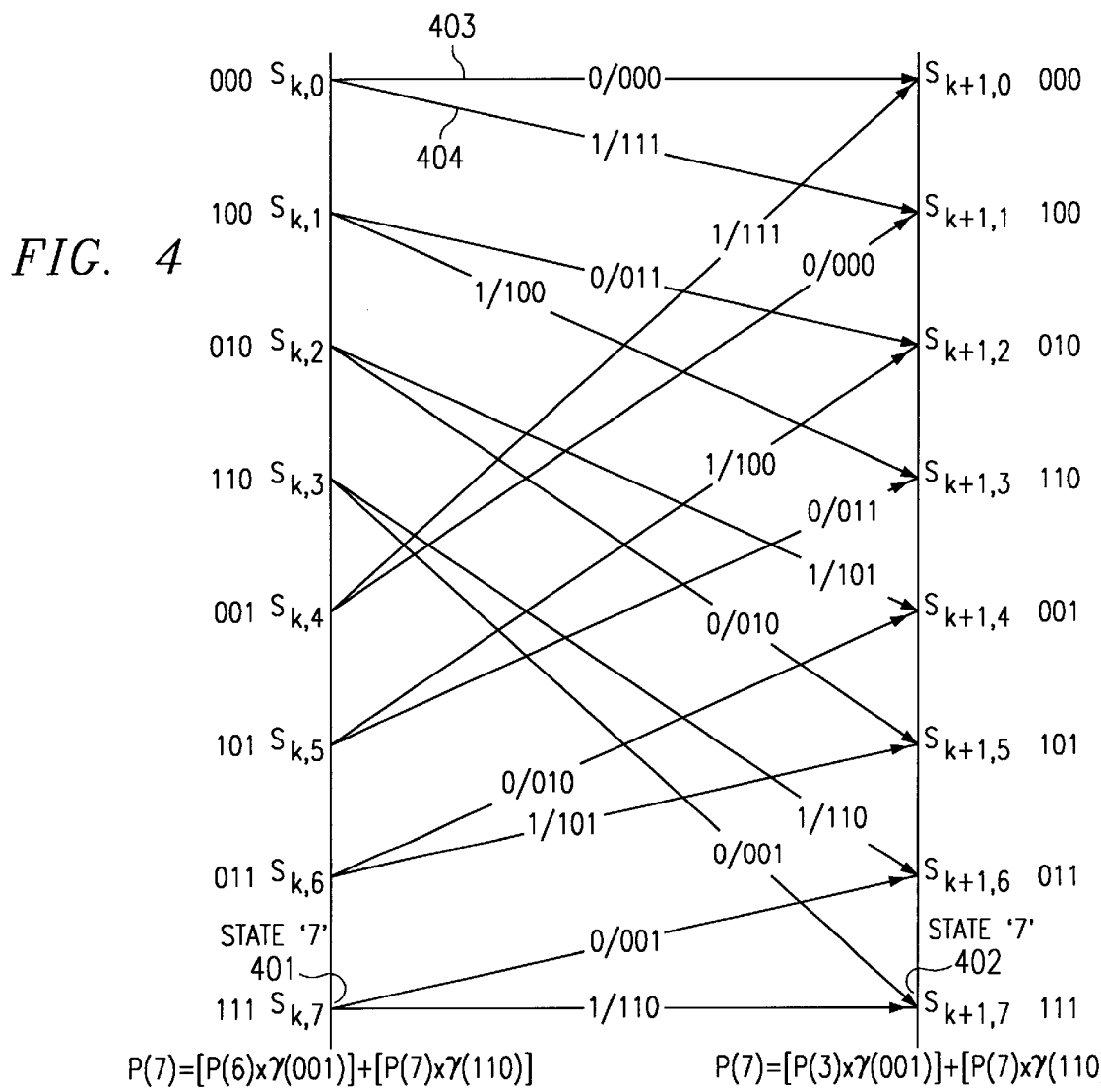
FIG. 4 illustrates the trellis diagram for a rate ⅓ turbo encoder of the prior art.
Figure 5:
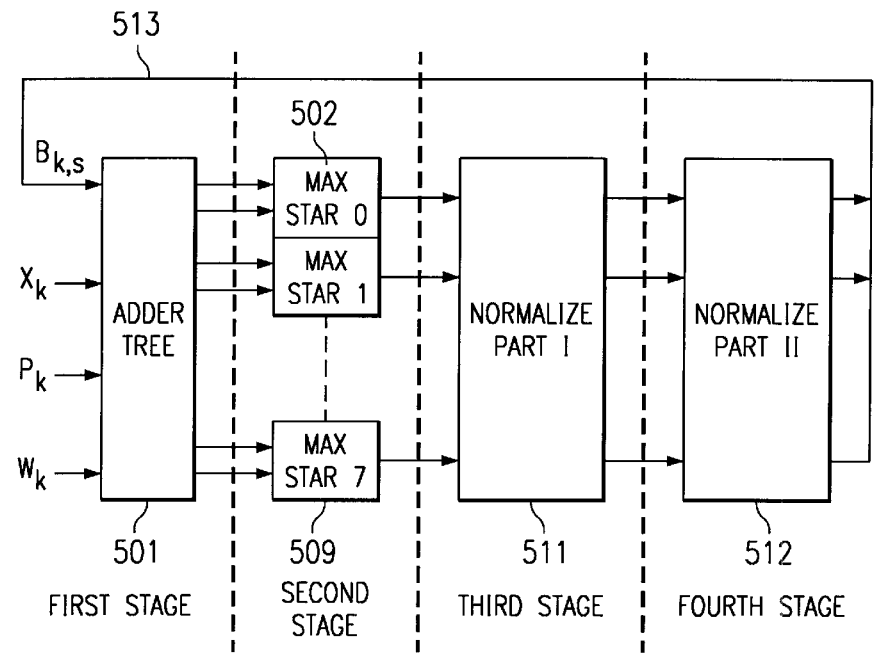
FIG. 5 illustrates an example implementation of a beta state metric block of the prior art.
Figure 6:
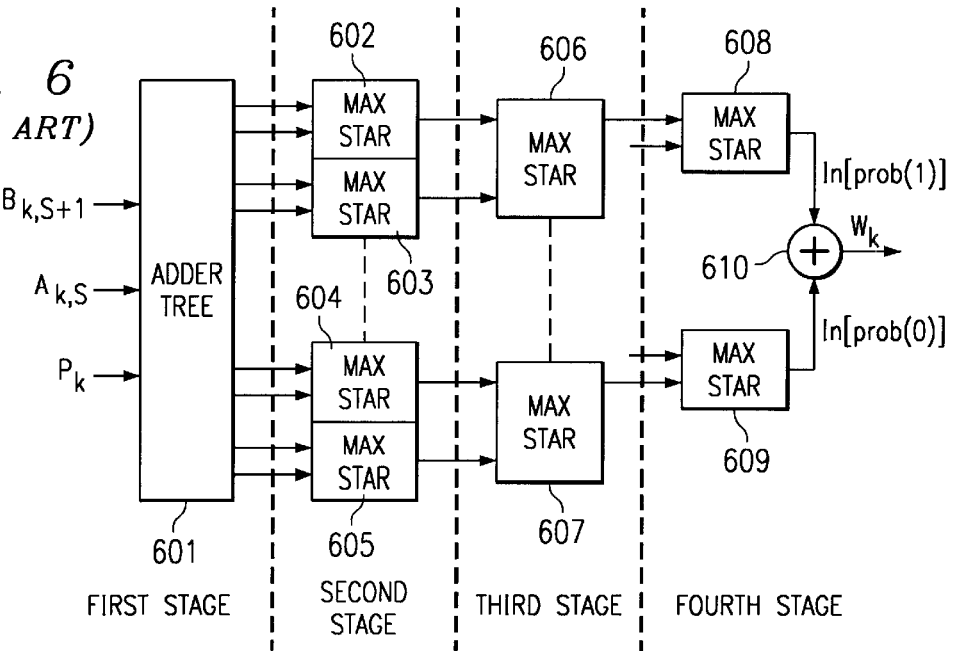
FIG. 6 illustrates an example implementation of a extrinsic block of the prior art.

Two's complement normalization techniques have been proposed by designers of both Viterbi and for turbo decoders. In the case of turbo decoders, the normalization has been applied only to the alpha and beta blocks and not to the extrinsic block. The technique of this invention relates to the representation of state metrics with numbers that use two's complement numbers which may also be referred to as signed fixed-point numbers. For example, if the precision of the signal is 8 bits; then the numbers will range from −128 to 127. For the remainder of this treatment, 8-bit precision will be assumed. Using two's complement representation allows the normalization stages to be removed from the beta and alpha state metric blocks 511 and 512, respectively, in FIG. 5.

This simplification allows those blocks to be built with only two stages. This saves both gates and latency. The value of the state metrics will grow for each iteration of the trellis. This is due to the max star function. When the numbers exceed the maximum positive number that can be represented by a specific number of bits, further increase in the variable will cause the number to wrap to the most negative number.

Figure 7:
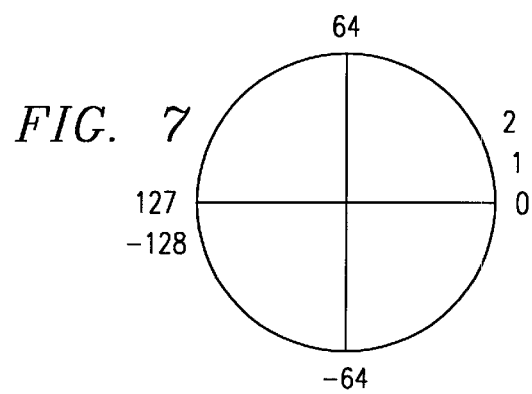
FIG. 7 illustrates the circle diagram representation of 8-bit signed integers.
Figure 8A:
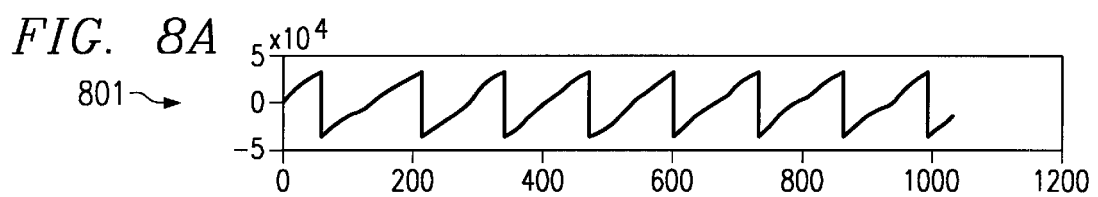
FIGS. 8A–8G illustrates the simulation results using two's complement representation for the extrinsics.
Figure 8B:
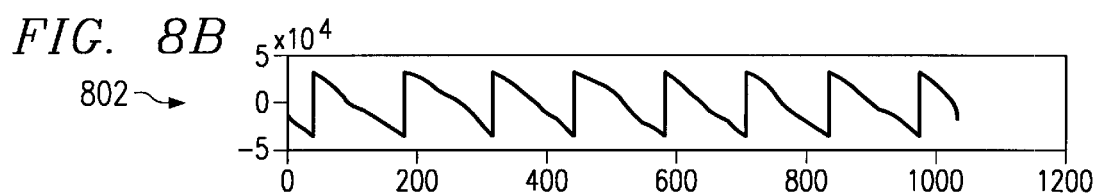
Figure 8C:
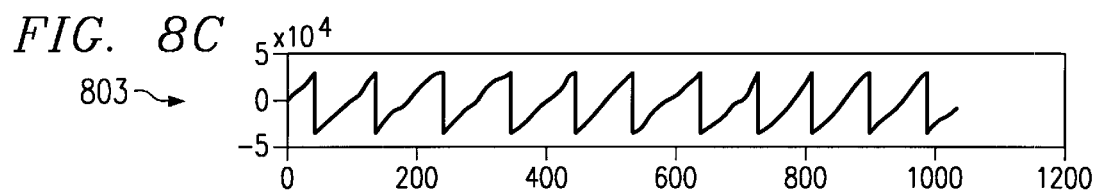
Figure 8D:
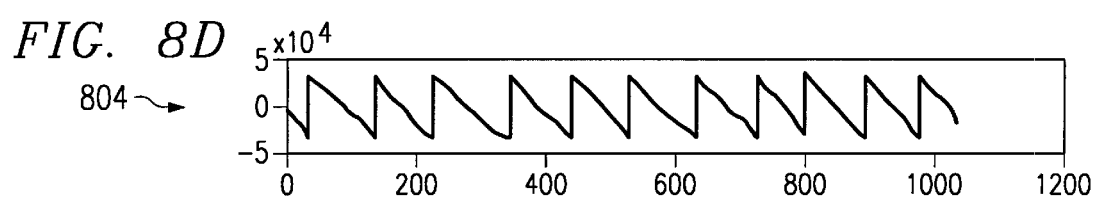
Figure 8E:
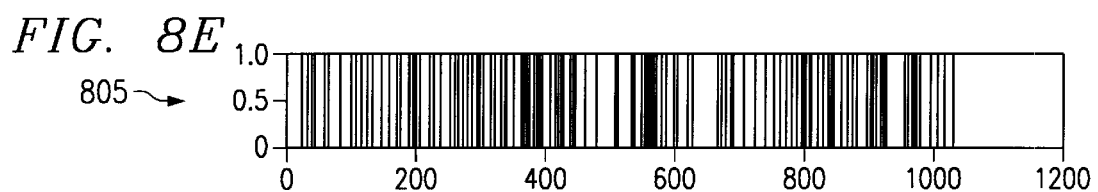
Figure 8F:
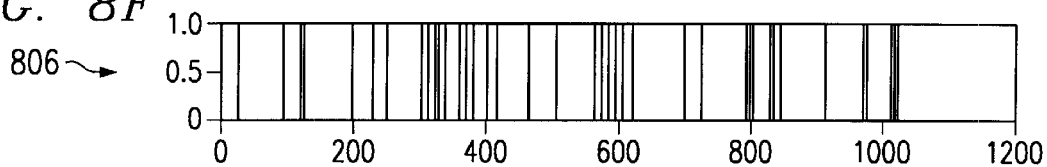
Figure 8G:
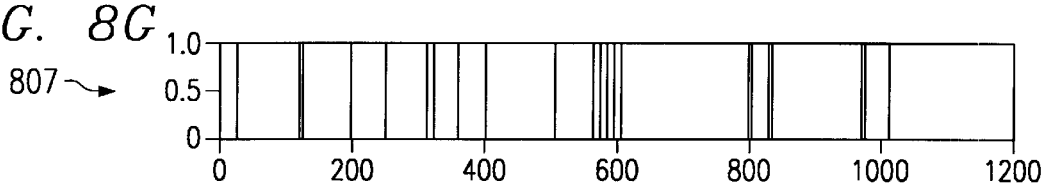

For example, adding 2 to 127 causes a overflow to −127:

$$\begin{array}{r} 127 \quad 0111 \quad 1111 \\ +\phantom{00}2 \quad 0000 \quad 0010 \\ \hline 129 \quad 1000 \quad 0001 \\ -127 \quad 1000 \quad 0001. \end{array}$$ which is the same as:

FIG. 7 represents the 8 bit signed integers with a circle in which positive overflows wrap to the negative part of the circle. This technique will work as long as the values for each of the S-states resides in one half of the circle for each recursive operation. If the value for the S-states resides in more than 2 adjacent quarters of the circle, then it will not be possible to determine fixed-point overflows. This situation could happen if there are not enough bits for these signals. Therefore, enough bits must be available, for each iteration of the trellis, so that the S state metrics cannot increase more than one quarter of the circle.

This technique works for both the beta and the alpha state metric calculations. Next consider the extrinsic calculation. Conventional designs do not perform extrinsics calculations using the twos complement number representation because it is not straightforward.

The general form of the extrinsic equation is:

$$\ln[\text{Prob}[1]] = \ln[\Sigma \exp(A_k + \Gamma_k + B_{k+1})] \qquad [11]$$

The adder tree for the extrinsic block sums the beta, alpha and gamma (parity) signals together. The beta and alpha state metric data entering the extrinsic block can range anywhere on the circle in FIG. 7. Adding the numbers together is not straightforward if the numbers cross the 127/−128 boundary.

For example consider the case $\Gamma_k = -2$ and
$A_{k,S} = \{130, 128, 125, 120, 121, 122, 124, 124\}$
[max($A_{k,S}$)=130, state=0] and
$B_{k+1,S} = \{124, 131, 124, 124, 124, 124, 124, 124\}$
[max($B_{k+1,S}$)=131, state=1].
Because of the two's complement representation and wrap around occurring these would have the representation:
$A_{k,S} = \{-126, -128, 125, 120, 121, 122, 124, 124\}$ and
$B_{k+1,S} = \{124, -125, 124, 124, 124, 124, 124, 124\}$
or in full precision representation:
$$\ln[\text{Prob}[1]] = \ln[e^{[130+131-2]} + e^{[128+124-2]} + e^{[124+124-2]} + \ldots ]$$

and in two's complement representation:
$$\ln[\text{Prob}[1]] = \ln[e^{[-126+131-2]} + e^{[-128+124-2]} + e^{[124+124-2]} + \ldots ]$$

Summing the first three operands together results in 259, 250, 246, . . . in which 259 is the largest (correct answer) and in two's complement representation −253, −6, 247, . . . in which −253 is not the largest (incorrect answer).

FIG. 8 shows the problem graphically in which the two's complement state metric numbers are directly applied to the extrinsic block. The x-axis for each curve represents the data at point k in a decoded block of size 1024. The first two curves, 801 and 802, are the respective alpha and beta state metrics after the first MAP decode. The second pair of curves, 803 and 804, are the respective alpha and beta state metrics after the second MAP decode. The fifth curve 805 shows the errors in the original block of data. The sixth curve 806 shows the errors in the block after one complete turbo decoder iteration. The seventh curve 807 shows the new errors which were introduced due to the first iteration. Notice that some of the new errors are aligned near the points in which the alpha and beta state metrics overflowed. This leads to the conclusion that the two's complement solution for the extrinsics generates new errors, which is clearly not desirable.

Figure 9:
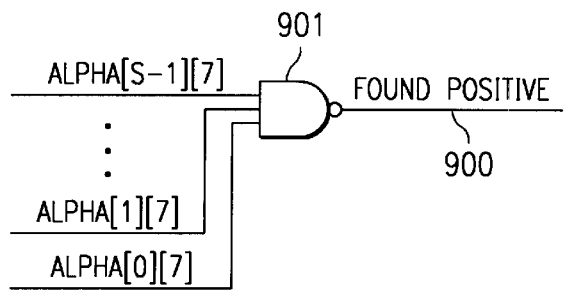
FIG. 9 illustrates the implementation of the 'found positive' logic.

The extrinsic solution to fix the problem in which the beta and alpha numbers cross the 127/−128 boundary of the circle is as follows:

1. Check all the metrics to determine if any are positive. Check the most significant bit (MSB) for all the alpha state metrics and generate a Found-Positive signal 900. FIG. 9 illustrates NAND gate 901 generating this Found-Positive signal 900 from the most significant bit [7] of S alpha signals alpha[0][7] to alpha[S-1][7]. Any 0 in the most significant bit (bit 7) of one of the alpha state metrics causes NAND gate 901 to generate a 1 Found-Positive signal 900.

Figure 10:
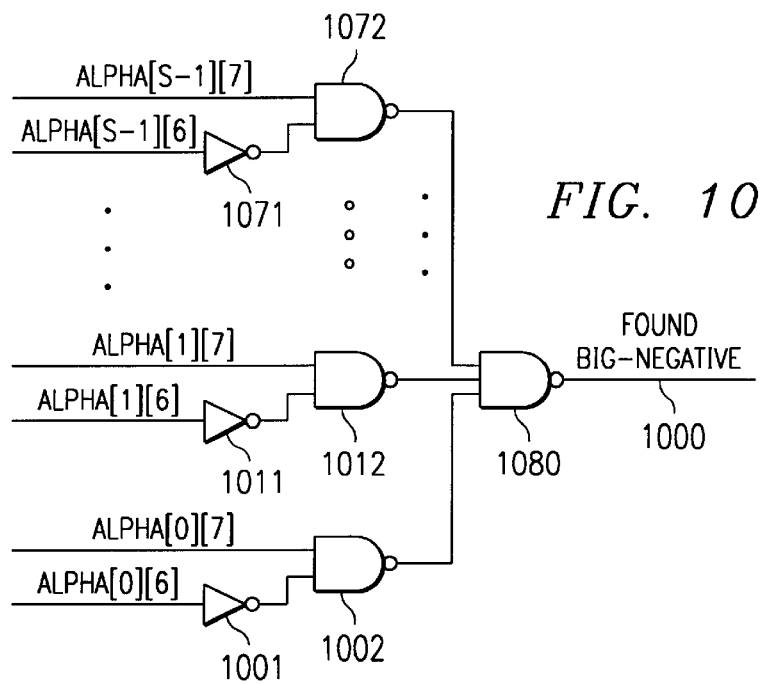
FIG. 10 illustrates the implementation of the 'found big negative' logic.

2. Check all the metrics to determine if any are in the most negative quadrant of the circle in FIG. 7 and generate a Found-Big-Negative signal 1000. This check is made by checking the two most significant bits of the S alpha signals. A signal is a big negative number if the most significant bit is 1 and the next most significant bit is 0. FIG. 10 illustrates a circuit generating Found-Big-Negative signal 1000 from the most significant bit [7] and the next most significant bit [6] of S alpha signals from alpha[0][7]/alpha[0][6] to alpha[S-1][7]/alpha[S-1][6]. Invertors 1001, 1011 . . . 1081 invert the respective next most significant bits alpha[0][6], alpha[1][6] . . . alpha[S-1][6]. NAND gates 1002, 1012 . . . 1072 determine if respective most significant bits alpha[0][7], alpha[1][7] . . . alpha[S-1][7] are 1 and the corresponding next most significant bits alpha[0][6], alpha[1][6] . . . alpha[S-1][6] are 0. If so the NAND gates 1002, 1012 . . . 1072 generate a 0 output. NAND gate 1080 determines if any of the NAND gates 1002, 1012 . . . 1072 generate a 0 output indicating a signal in the most negative quadrant. If so, NAND gate 1080 generates a 1 Found Big-Negative signal 1000.

Figure 11:
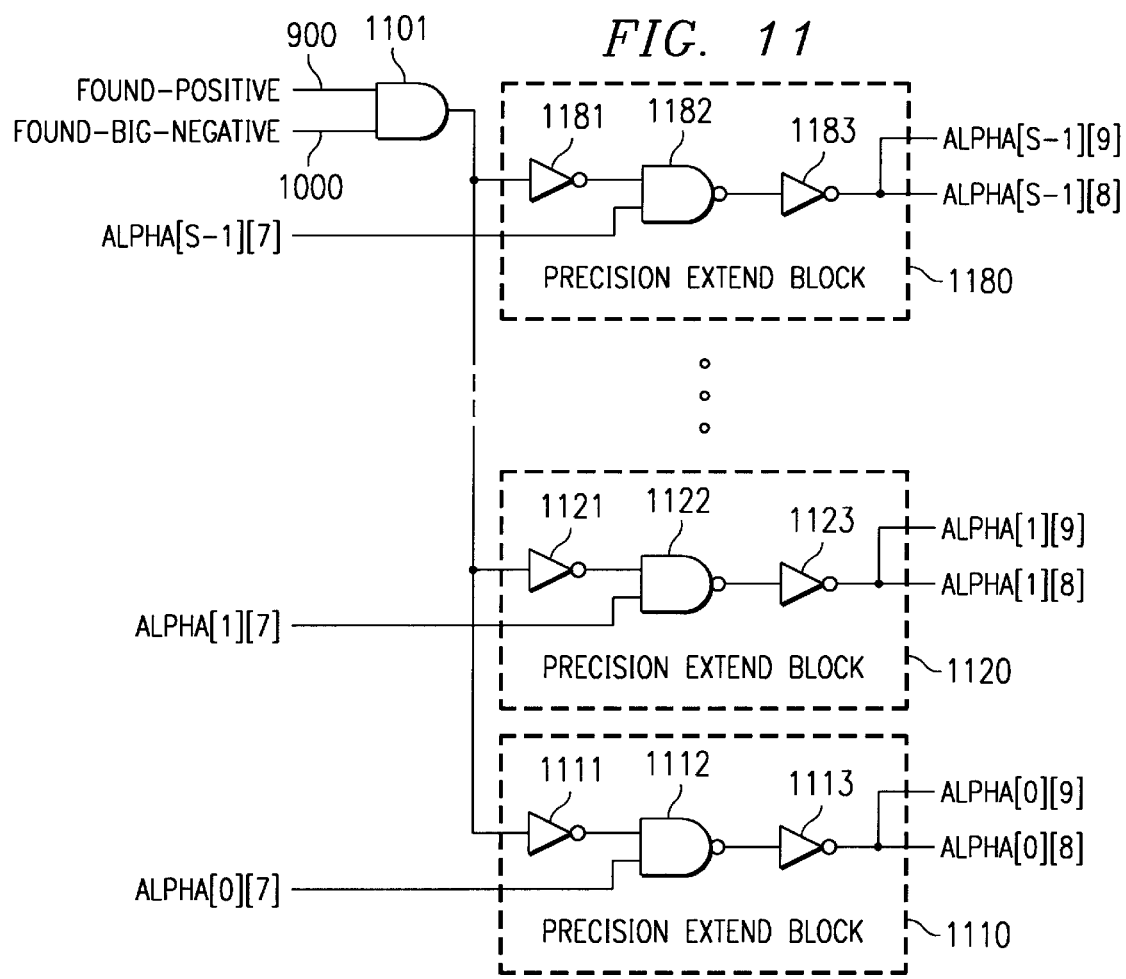
FIG. 11 illustrates the functional diagram of the precision extend block.

3. The extrinsic adder tree sums three signals $A_k$, $B_{k+1}$ and Γ. If the precision of the three operands is 8 bits, and the inputs include either a large positive number or large negative number then 10 bits are necessary for the sum to avoid overflow and incorrect results. FIG. 11 illustrates a circuit to perform this function. AND gate 1101 generates Found-Circle-Boundary-Cross signal 1100 from Found-Positive signal 900 and Found-Big-Negative signal 1000. If Found-Circle-Boundary-Cross signal 1100 is 1, then the alpha and beta operands are precision extended in precision extend blocks 1110, 1120 to 1180.

Table 1 shows the logical table for the precision extend blocks 1110, 1120 to 1180. For the 8-bit data of this example, the 2-bit output of precision extend blocks 1110, 1120 to 1180 represents bit numbers 9 and 8 of the data. These two additional most significant bits are appended to the 8 bits (bit numbers 7 to 0) of the corresponding input metric data. The extrinsic block 305 then operates on this extended precision data. Normalization is not required in extrinsic block 305 because this invention provides intelligent precision extension to prevent overflow.

TABLE 1

| Found Circle-Boundary-Cross | Alpha or Beta MSB | Output (2-bits) |
|---|---|---|
| 0 | 0 | 00 |
| 0 | 1 | 11 |
| 1 | 0 | 00 |
| 1 | 1 | 00 |

Table 1 shows normal sign extension to 10 bits if Find Circle-Boundary-Cross is 0. If Find Circle-Boundary-Cross is 1, then the data is zero extended instead. This negates any adverse consequences of crossing the big positive to big negative boundary during the extrinsics summation.

FIG. 11 illustrates implementation of Table 1 with three gates. Each extend precision block 1110, 1120 to 1180 receives the most significant bit (bit 7) of a corresponding alpha signal 0 to 7 and the Found-Circle-Boundary signal 1100. Found-Circle-Boundary signal 1100 supplies an input to inverters 1111, 1121 to 1181. The output of inverters 1111, 1121 to 1181 supply one input to respective NAND gates 1112, 1122 to 1182. A second input of the NAND gates 1112, 1121 to 1182 receives the respective most significant bit signals alpha[0][7], alpha[1][7] to alpha[S-1][7]. The output of NAND gates 1112, 1121 to 1182 supplies the inputs of respective inverters 1113, 1123 to 1183. The output of the inverters 1113, 1123 to 1183 supply the respective precision extend signals for bits 9 and 8. Note that this same circuit is repeated for beta metrics.

The total design requires 43 gates to expand the alpha state metrics and 43 gates to expand the beta state metrics for a total of 86 gates as shown in Table 2. Note that this example assumes blocks of eight instances of 8-bit alpha metric data and 8-bit beta metric data.

TABLE 2

| Function | Number of Gates |
|---|---|
| Found Positive | 1 |
| Found Big Negative | 1 + 2 * 8 = 17 |
| Precision Extend | 1 + 3 * 8 = 25 |
| Alpha Subtotal | 43 |
| Beta Subtotal | 43 |
| Total | 86 |

The Found Positive function illustrated in FIG. 9 requires only a single NAND gate 901. The Found Big Negative function illustrated in FIG. 10 requires an invertor 1001, 1011 . . . 1071 and a NAND gate 1002, 1012 . . . 1072 for each of the eight instances of alpha/beta data and a final NAND gate 1080. The Precision Extend function requires a single AND gate 1101 and a 3-gate precision extend block for each of the eight instances of alpha/beta data.

Figure 12:
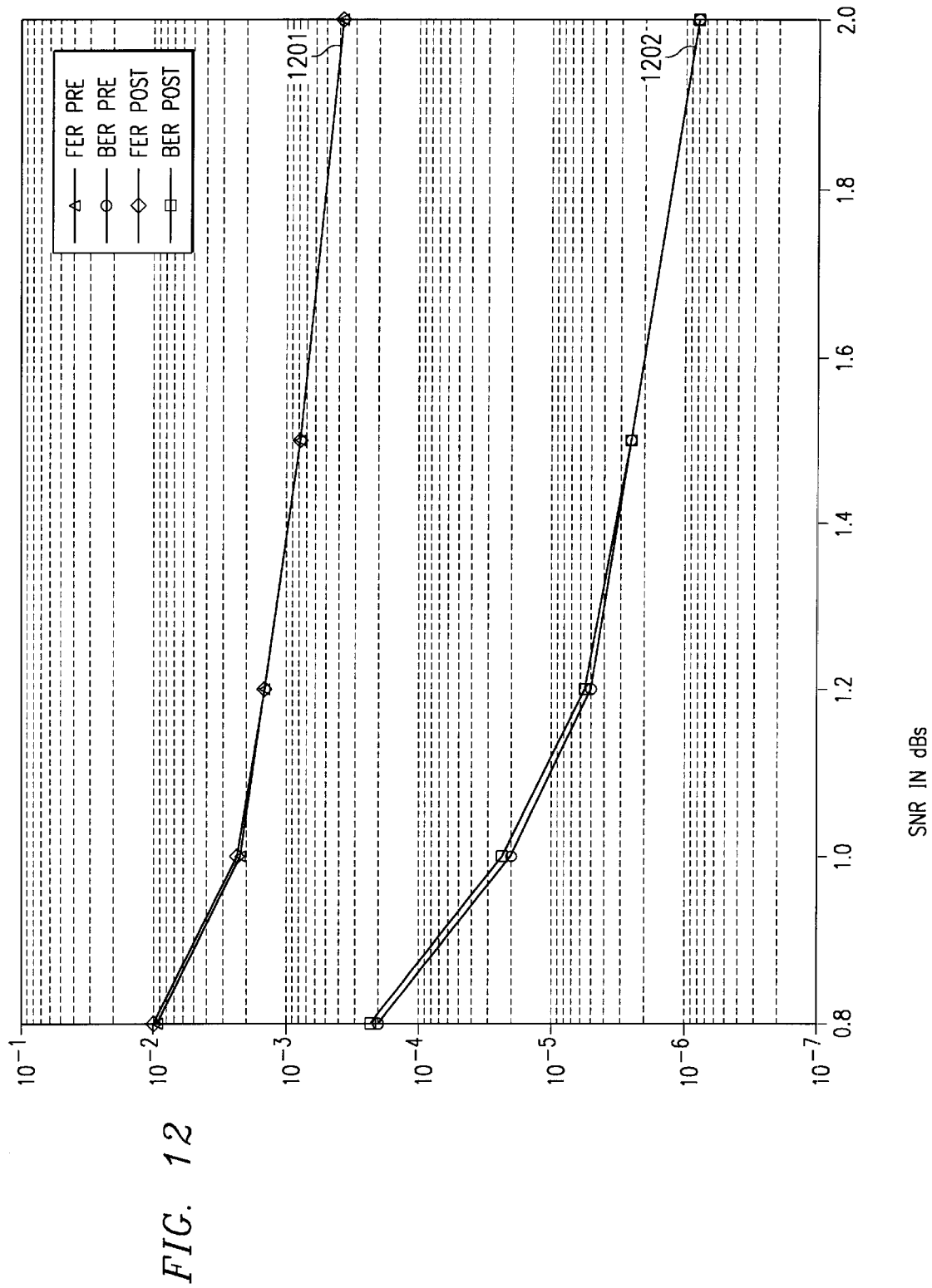
FIG. 12 illustrates the performance results of a simulation of normalization versus two's complement with extrinsic modification.

FIG. 12 illustrates simulated bit error ratio (BER) and frame error ratio (FER) versus signal to noise ratio (SNR) curves comparing the two techniques. The curves are nearly identical. Curve 1201 shows the curves for the simulation frame error rate. Curve 1202 shows the curves for the simulation bit error rate. In both cases the data for the prior art normalization stages are virtually the same as the data for the two's complement representation with the modified extrinsic block of this invention.

The technique of this invention removed the normalization stages for the beta and alpha state metric blocks. This reduces the latency to perform the normalization and reduces the number of gates to perform the normalization exclusively within the extrinsic block. This invention enables the extrinsic block to work with the two's complement representation. This technique adds only 86 gates to the extrinsic block and achieves identical BER performance to the conventional normalization in the alpha and beta metrics blocks.

What is claimed is:

1. A turbo decoder extrinsic calculation block comprising:

a plurality of alpha metric inputs, each alpha metric input having a predetermined number of bits;

an alpha circle boundary detector receiving said plurality of alpha metric inputs and generating an alpha circle boundary cross signal indicating whether the two's complement format of any alpha metric input is either a two's complement positive number or a two's complement negative number in a most negative quadrant or not;

a plurality of alpha metrics precision extend block, each alpha metrics precision extend block receiving said alpha circle boundary cross signal and a most significant bit of a corresponding alpha metric input and generating a two bit precision extension for said corresponding alpha metric input dependent upon said alpha circle boundary cross signal and said most significant bit of said alpha metrics input;

a plurality of beta metric inputs, each beta metric input having said predetermined number of bits;

a beta circle boundary detector receiving said plurality of beta metric inputs and generating a beta circle boundary cross signal indicating whether the two's complement format of any beta metric input is either a two's complement positive number or a two's complement negative number in a most negative quadrant or not;

a plurality of beta metrics precision extend blocks, each beta metrics precision extend block receiving said beta circle boundary cross signal and a most significant bit of a corresponding beta metric input and generating a two bit precision extension for said corresponding beta metric input dependent upon said beta circle boundary cross signal and said most significant bit of said beta metrics input; and an extrinsics block receiving said alpha metrics inputs as precision extended by said corresponding alpha precision extend block and said beta metrics inputs as precision extended by said corresponding beta precision extend block, said extrinsics block including an adder constructed to operate on two's complement numbers having two more than said predetermined number of bits.

2. The turbo decoder extrinsic calculation block of claim 1, wherein:

each alpha metrics precision extend block generating said two bit precision extension for said corresponding alpha metric input as two bits equal to said most significant bit of said corresponding alpha metric input if said alpha circle boundary cross signal indicates that said two's complement format of any alpha metric input is neither a two's complement positive number nor a two's complement negative number in a most negative quadrant, and two bits equal to 00 if said alpha circle boundary cross signal indicates that said two's complement format of any alpha metric input is either a two's complement positive number or a two's complement negative number in a most negative quadrant; and each beta metrics precision extend block generating said two bit precision extension for said corresponding beta metric input as two bits equal to said most significant bit of said corresponding beta metric input if said beta circle boundary cross signal indicates that said two's complement format of all beta metric inputs is neither a two's complement positive number nor a two's complement negative number in a most negative quadrant, and two bits equal to 00 if said beta circle boundary cross signal indicates that said two's complement format of any one beta metric input is either a two's complement positive number or a two's complement negative number in a most negative quadrant.

3. The turbo decoder extrinsic calculation block of claim 2, wherein:

each of said alpha metrics precision extend block includes
an alpha precision extend first inverter having an input receiving said alpha circle boundary cross signal and an output,
an alpha precision extend NAND gate having a first input connected to said output of said alpha precision extend first inverter, a second input receiving said most significant bit of said corresponding alpha metric input and an output,
an alpha precision extend second inverter having an input connected to said output of said alpha precision extend NAND gate and an output supplying said two bit precision extension for said corresponding alpha metric input; and each of beta alpha metrics precision extend block includes
a beta precision extend first inverter having an input receiving said beta circle boundary cross signal and an output,
a beta precision extend NAND gate having a first input connected to said output of said beta precision extend first inverter, a second input receiving said most significant bit of said corresponding beta metric input and an output,
a beta precision extend second inverter having an input connected to said output of said beta precision extend NAND gate and an output supplying said two bit precision extension for said corresponding beta metric input.

4. The turbo decoder extrinsic calculation block of claim 1, wherein:

said alpha circle boundary detector includes
an alpha found-positive circuit receiving a most significant bit of each of said plurality of alpha metric inputs and generating an alpha found-positive signal indicating whether the two's complement format of any of said alpha metric inputs is positive or not,
an alpha found-big-negative circuit receiving two most significant bits of each of said plurality of alpha metric inputs and generating an alpha found-big-negative signal indicating whether the two's complement format of any of said alpha metric inputs is in a most negative quadrant or not, and
an AND gate having a first input receiving said alpha found-positive signal, a second input receiving said alpha found-big-negative signal and an output generating said alpha circle boundary cross signal; and said beta circle boundary detector includes
a beta found positive circuit receiving a most significant bit of each of said plurality of beta metric inputs and generating a beta found-positive signal indicating whether the two's complement format of any of said beta metric inputs is positive or not,
a beta found-big-negative circuit receiving two most significant bits of each of said plurality of beta metric inputs and generating a beta found-big-negative signal indicating whether the two's complement format of any of said beta metric inputs is in a most negative quadrant or not, and
an AND gate having a first input receiving said beta found-positive signal, a second input receiving said beta found-big-negative signal and an output generating said beta circle boundary cross signal.

5. The turbo decoder extrinsic calculation block of claim 4, wherein:

said alpha found-positive circuit comprises a NAND gate having a plurality of inputs, each input receiving said most significant bit of one of said plurality of alpha metric inputs and an output generating said alpha found-positive signal; and said beta found-positive circuit comprises a NAND gate having a plurality of inputs, each input receiving said most significant bit of one of said plurality of beta metric inputs and an output generating said beta found-positive signal.

6. The turbo decoder extrinsic calculation block of claim 4, wherein:

said alpha found-big-negative circuit comprises
a plurality of alpha input NAND gates, each alpha input NAND gate having a first input receiving said most significant bit of a corresponding one of said plurality of alpha metrics inputs, a second input and an output,
a plurality of invertors, each invertor having an input receiving a second most significant bit of a corresponding on of said plurality of alpha metrics inputs and an output connected to said second input of a corresponding one said plurality of alpha input NAND gates, and
an alpha output NAND gate having a plurality of inputs, each input connected to said output of a corresponding one of said alpha input NAND gates and an output generating said alpha found-big-negative signal;

said beta found-big-negative circuit comprises
a plurality of beta input NAND gates, each beta input NAND gate having a first input receiving said most significant bit of a corresponding one of said plurality of beta metrics inputs, a second input and an output,
a plurality of invertors, each invertor having an input receiving a second most significant bit of a corresponding on of said plurality of beta metrics inputs and an output connected to said second input of a corresponding one said plurality of beta input NAND gates, and
a beta output NAND gate having a plurality of inputs, each input connected to said output of a corresponding one of said beta input NAND gates and an output generating said beta found-big-negative signal.

* * * * *